June 13, 1972 M. P. LEPSELTER 3,669,730

MODIFYING BARRIER LAYER DEVICES

Original Filed Aug. 1, 1968 2 Sheets-Sheet 1

INVENTOR
M. P. LEPSELTER
BY [signature]
ATTORNEY 3,669,730
MODIFYING BARRIER LAYER DEVICES Martin Paul Lepselter, Bethlehem, Pa., assignor to Bell Telephone Laboratories, Incorporated, Murray Hill and Berkeley Heights, N.J.

Original application Aug. 1, 1968, Ser. No. 749,396. Divided and this application Apr. 24, 1970, Ser. No. 31,730
Int. Cl. H01l 9/00
U.S. Cl. 117—200 4 Claims

ABSTRACT OF THE DISCLOSURE

A method is described for producing surface barrier diodes with predetermined barrier heights. At least two metals are mixed in a predetermined proportion and deposited on a silicon substrate. Sufficient heat is applied to cause the metals to react with the substrate, forming a mixed metal silicide region. By varying the proportions of the metals a desired barrier height can be achieved.

This application is a division of copending application Ser. No. 749,396, filed Aug. 1, 1968 and now abandoned.

BACKGROUND OF THE INVENTION

This invention relates to semiconductor diodes of the barrier or Schottky type.

Surface barrier diodes, which are based on non-ohmic behavior at a metal-to-semiconductor junction, are well known. The electrical characteristics of these devices depend on the work function of the metal as well as the electron affinity of the semiconductor. Several known structures which are effective rectifying barriers are described in Bell System Technical Journal, vol. XLIV, pp. 1525–1528 (1965) and vol. XLIII, pp. 215–224 (1964).

Variation in the conduction properties of the barrier can be obtained by changing the materials which form the barrier. Ordinarily to obtain a new characteristic a different contact metal is used. For instance, a platinum silicide-Si diode has a barrier height .85 while a copper-silicon barrier has been measured at 0.58 volt. However, if a mechanism was available for continuously adjusting this value an ideal diode could be made to fit a given device application.

SUMMARY OF THE INVENTION

According to this invention a surface barrier diode can be made to exhibit a desired current-voltage characteristic by providing a metal contact having the appropriate work function in relation to the semiconductor. This idealized work function is obtained by doping or mixing different metals to form the metal contact.

BRIEF DESCRIPTION OF THE DRAWINGS

These and other aspects of the invention are explained more fully in the following detailed description. In the drawing.

DETAILED DESCRIPTION

Figure 1A:
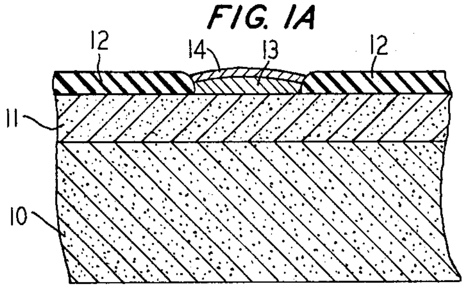
FIGS. 1A to 1C are a series of front sectional views of a semiconductor wafer being processed in accordance with the teachings of this invention to form a diode with a composite metal contact.
Figure 1B:
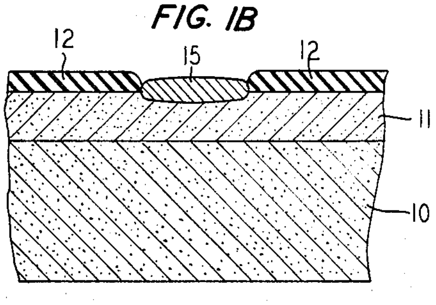
Figure 1C:
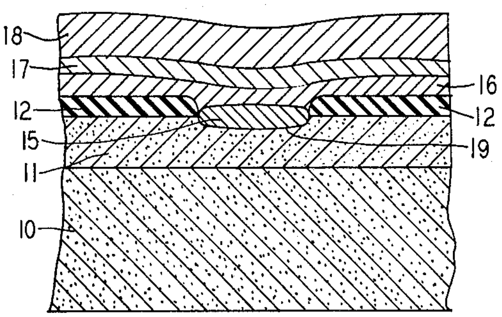

FIGS. 1A to 1C illustrate a typical sequence of operations for making a barrier in accordance with the invention. In FIG. 1A, an n-type silicon substrate 10 is shown which has a less heavily doped n-type epitaxial silicon layer 11 deposited uniformly over its top surface. The insulating mask 12 defines the barrier region. The barrier is formed by depositing a combination of at least two metals, such as platinum and rhodium, over the exposed silicon. The metal layers are represented in FIG. 1A as layers 13 and 14. The metals can be codeposited from an alloy or from two sources, or can be deposited separately. The metals are evaporated by standard techniques, or sputtered over the entire surface.

The structure is then heated causing the metals to react with the underlying silicon to form a composite silicide of the deposited metals as shown in FIG. 1B. The silicide layer 15 forms partially within the surface of the epitaxial silicon and partially above the surface due to a portion of the silicon crystal being the source of Si in the silicide. The region 15 is composed mainly of reacted metal silicides. Contact is then made to the composite metal silicide layer by standard techniques. The contact shown in FIG. 1C is a standard beam lead contact consisting of for instance 1000 A. of titanium, 16, 3000 A. of platinum, 17, and 10$\mu$ of gold, 18, as an overlay. If the layers 13 and 14 (FIG. 1A) are deposited over the entire surface of the structure it may be desirable to remove the unwanted metal by sputtering. In the finished device shown in FIG. 1C the barrier of interest is indicated at 19. This form of diode which relies on a metal silicide-silicon barrier is especially effective since the barrier is formed within the semiconductor body as a consequence of the alloying process. Thus it is relatively independent of the surface state of the silicon before the mixed metal film is deposited. The silicide is known to form an effective rectifying barrier with silicon.

Figure 2:
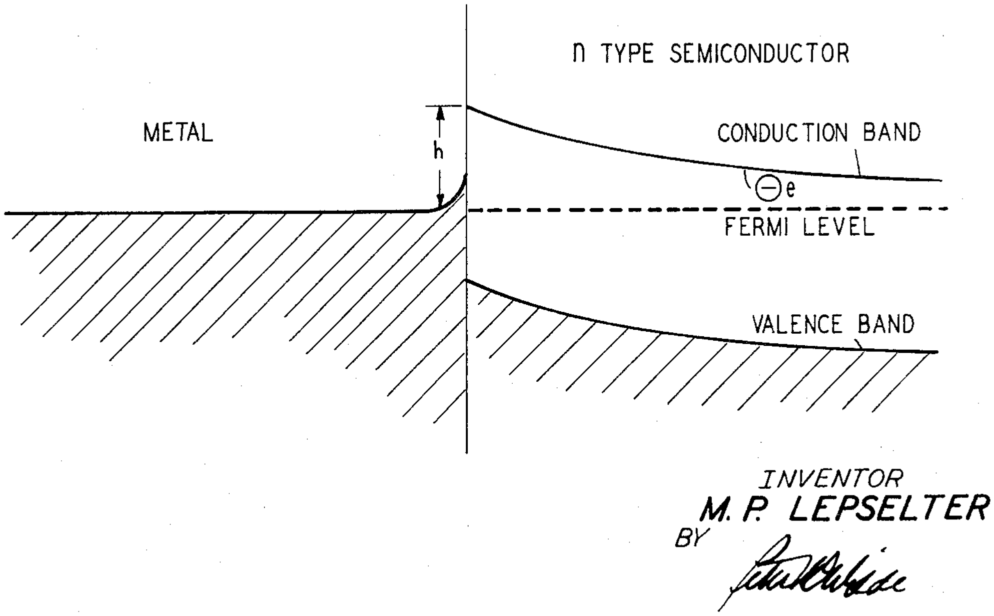
FIG. 2 is an energy level diagram for a typical metal-semiconductor barrier.

The structure of FIG. 1C is shown as exemplary of a class of devices which function because of a metal-semiconductor rectifying barrier. The invention is broadly applicable to all forms of such devices as will become apparent from the following:

FIG. 2 is an energy level diagram of a metal-semiconductor barrier. The energy necessary for an average electron, *e*, to flow in the "reverse" direction is determined largely by the barrier height *h*. The barrier height is equal to the difference in work function between the metal and the semiconductor, or more descriptively, between the Fermi distribution levels of the bulk metal and bulk semiconductor. This relationship points out the essential requirement that the work function of the metal must exceed the corresponding property of the semiconductor in order that a barrier be present. If this condition is not met an ohmic junction results.

Referring back to FIG. 2, as a forward voltage is applied across the barrier the Fermi level in the semiconductor is distorted upward and a continuously increasing number of electrons have sufficient energy to flow across the apparently lower barrier. With a reverse bias the Fermi level in the semiconductor is driven to a deeper energy level and the barrier is effectively raised.

The expression for current flow across the barrier is $$I = A^* T^2 e^{-q\phi/kT} \text{ amperes/cm.}^2$$

where

A* is the Richardson constant describing the thermionic emission into the semiconductor (<120 amperes/cm.$^2$ deg.$^2$), T is the temperature, $q$ is the charge of the carrier, $k$T is the usual Boltzmann expression, and $\phi$ is the barrier height. The objective of this invention is to vary $\phi$ and thereby adjust the conduction properties of the barrier to a preselected characteristic.

The invention is demonstrated by the following examples.

Figure 3:
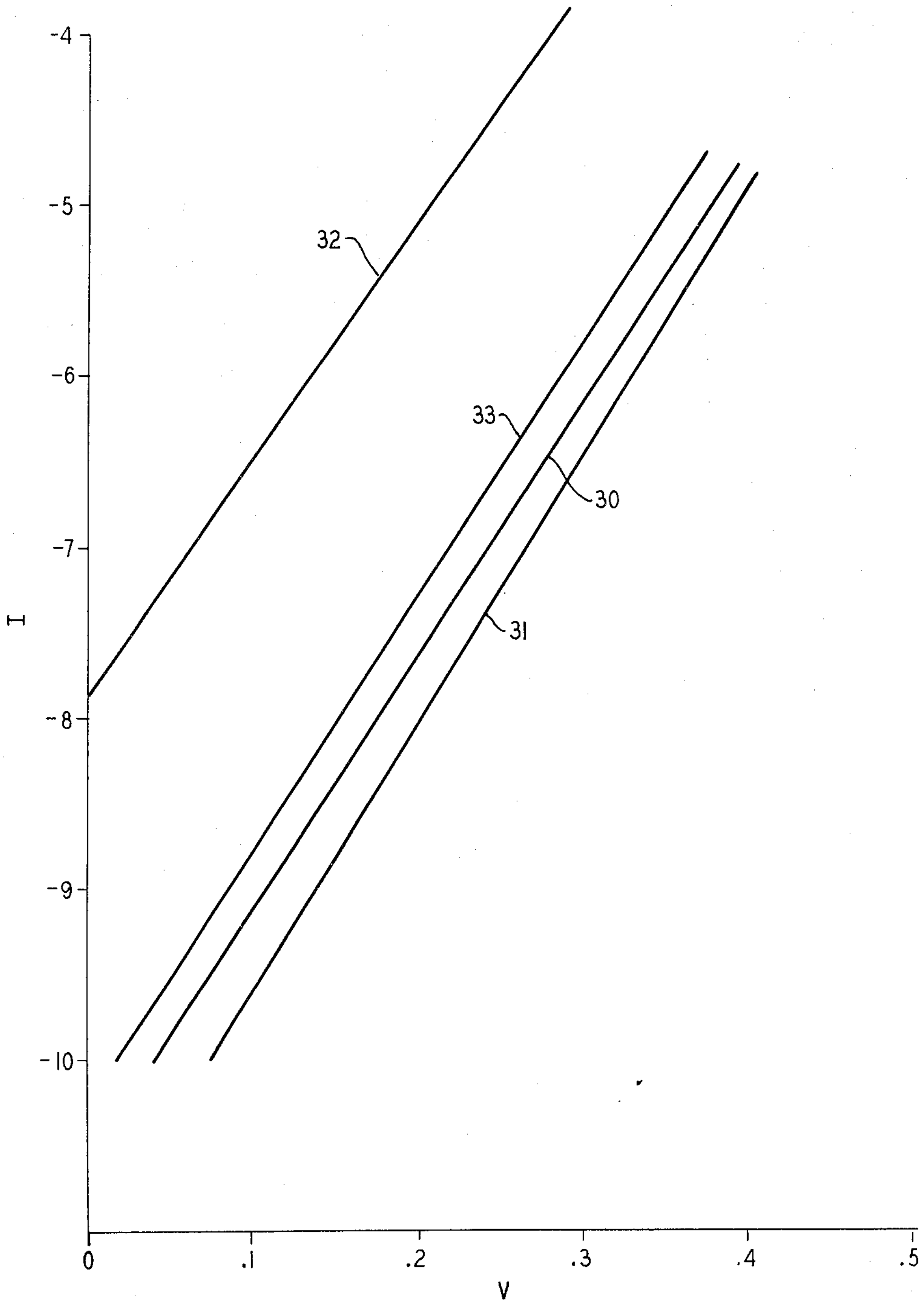
FIG. 3 is a plot of log current versus voltage for certain diodes made in accordance with the invention.

A diode similar to that of FIG. 1C is made with 1 ohm-cm. n-type silicon as the substrate layer 11. The support 10 is $n^+$ silicon and the insulating mask 12 is silicon oxide. The deposited metal is 500 A. rhodium 13 and 200 A. zirconium 14 deposited in either sequence or from an alloy anode. The structure is heated to a temperature of at least 500° C. for a period exceeding two minutes. This results in the formation of a Zr-Rh silicide layer 15 (FIG. 1B). Following the same procedure a titanium-rhodium silicide-to-silicon barrier device was made. The properties of the barriers produced by this method are indicated by the current-voltage plot of FIG. 3. The plot is the log of the forward current versus which gives a relatively linear representation of the barrier height. The barrier for the (ZrRh) Si diode, curve 30, is approximately 25 mv. lower than Rh-Si on silicon (curve 31), and 190 mv. higher than Zr-Si on silicon (curve 32). The conduction properties of the (TiRh) Si diode, shown in curve 33, are also substantially different from those of rhodium silicide-silicon (curve 31). From this it is evident that continuous adjustment of the barrier height between the end values can be obtained by varying the relative proportions of the metals deposited in film 19. Among the metals useful for this mixture are Zr, Ti, V, Cr, Mo, W, Au, Cu, Ni and the platinum group metals (atomic numbers 44–46 and 76–78).

Whereas this description is oriented towards barrier diodes it is obvious that other devices such as transistors, which essentially incorporate diode structures, can be made following the teachings of the invention. For example, field effect transistors employing metal-semiconductor barriers as the source and drain contacts are described in application Ser. No. 709, 461, filed Feb. 29, 1968 by M. P. Lepselter and S. M. Sze and assigned to the assignee of this invention, Bell Telephone Laboratories, Incorporated.

I claim:

1. A method for fabricating a surface barrier diode having a predetermined barrier height comprising the steps of:

codepositing on a silicon substrate a mixture of at least two metals selected from the group consisting of Ti, Zr, Rh, V, Cr, Mo, W, Ni, Cu, Au and the platinum group metals mixed in proportions selected to give the desired predetermined barrier height; and heating the silicon substrate to temperatures sufficient to allow the metals to react with the substrate thus forming a mixed metal silicide with a barrier height which deviates from the barrier height exhibited by a silicide of any of the individual metal components of the mixture by at least 25 mv.

2. The method of claim 1 wherein the deposited mixture consists of Ti and Rh.

3. The method of claim 1 wherein the deposited mixture consists of Zr and Rh.

4. The method of claim 1 wherein the temperature is at least 500° C.

References Cited

UNITED STATES PATENTS

| | | | |
|---|---|---|---|
| 3,399,331 | 8/1968 | Mutter et al. | 317—234 |
| 3,450,957 | 6/1969 | Saxena et al. | 317—235 X |
| 3,562,606 | 2/1971 | Heer et al. | 317—235 X |
| 3,290,570 | 12/1966 | Cunningham et al. | 117—212 X |
| 3,049,622 | 8/1962 | Ahlstrom et al. | 317—235 X |
| 3,386,894 | 6/1968 | Steppat | 117—212 X |
| 3,172,778 | 3/1965 | Gunther et al. | 117—213 |
| 3,274,670 | 9/1966 | Lepselter | 317—234 X |
| 3,290,127 | 12/1966 | Kahng et al. | 29—195 |

WILLIAM L. JARVIS, Primary Examiner

U.S. Cl. X.R.

117—107, 118, 212; 204—192; 317—235 UA